United States Patent [19]

Evers

[11] Patent Number: 5,810,926
[45] Date of Patent: Sep. 22, 1998

[54] METHOD AND APPARATUS FOR APPLYING ATOMIZED ADHESIVE TO A LEADFRAME FOR CHIP BONDING

[75] Inventor: Sven Evers, Boise, Id.

[73] Assignee: Micron Technology, Inc., Boise, Id.

[21] Appl. No.: 613,315

[22] Filed: Mar. 11, 1996

[51] Int. Cl.⁶ ..................................................... B05B 13/02
[52] U.S. Cl. ........................................................... 118/309
[58] Field of Search .................................. 156/356, 381; 118/309, 326

[56] References Cited

U.S. PATENT DOCUMENTS

| | | | |
|---|---|---|---|
| 2,338,650 | 1/1944 | Lowenthal | 118/DIG. 7 |
| 4,595,446 | 6/1986 | Newkirk et al. | 156/356 |
| 5,076,485 | 12/1991 | MacKay | 228/177 |
| 5,221,642 | 6/1993 | Burns | 156/233 |
| 5,258,647 | 11/1993 | Wojnarowski et al. | 257/687 |
| 5,286,679 | 2/1994 | Farnworth et al. | 438/118 |
| 5,304,842 | 4/1994 | Farnworth et al. | 257/668 |
| 5,444,923 | 8/1995 | Romm et al. | 34/233 |
| 5,448,450 | 9/1995 | Burns | 361/713 |

*Primary Examiner*—Francis J. Lorin
*Attorney, Agent, or Firm*—Trask Britt & Rossa

[57] ABSTRACT

An apparatus and method for evenly applying an atomized adhesive for bonding a die to a leadframe is disclosed. In one embodiment, the apparatus includes a hood in communication with an air supply and a vacuum plenum that encompass a semiconductor device component located in a target area during adhesive application so that the adhesive is selectively applied to specific portions of the leadframe or other semiconductor device component and adhesive is not allowed outside the system. A mask or stencil may be employed for further prevention of adhesive application to undesired areas. An air purge may be employed to direct the adhesive mist toward the component to be coated. In another embodiment, a fine adhesive spray is directed against the surface of the workpiece to be coated, selected areas being masked to prevent coating. Wafers may be coated as well as leadframes.

29 Claims, 6 Drawing Sheets

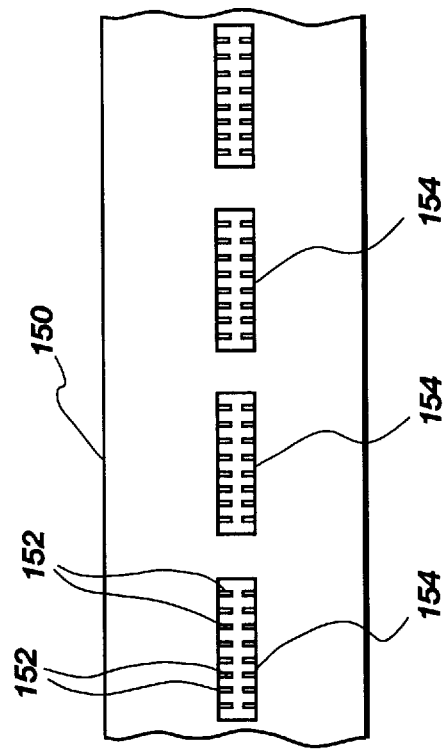
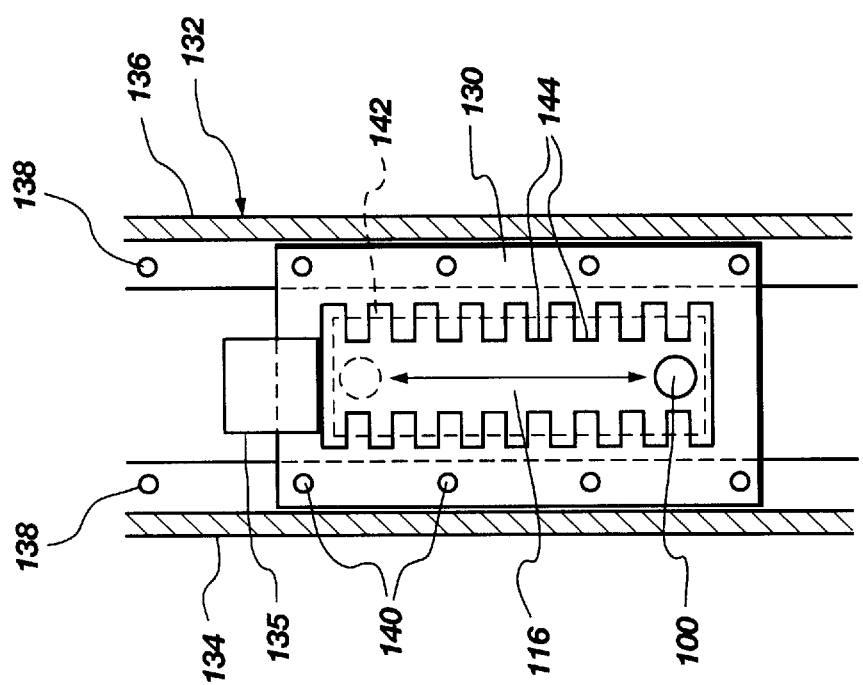
Fig. 8
Fig. 7

METHOD AND APPARATUS FOR APPLYING ATOMIZED ADHESIVE TO A LEADFRAME FOR CHIP BONDING

BACKGROUND OF THE INVENTION

1. Field of the Invention

This invention relates generally to a method and apparatus for bonding a bare semiconductor chip or die to a leadframe and, more specifically, to a method and apparatus for injecting and applying an atomized adhesive to a semiconductor device component.

2. State of the Art

A leadframe is basically the backbone of a typical molded plastic package. Leadframes serve first as a die support fixture during the assembly process and are subsequently electrically connected to the die bond pads after die-attach, as by wire bonding. After transfer molding, the leadframe becomes an integral part of the package. Generally, leadframes are fabricated from a strip of sheet metal by stamping or chemical milling (etching) and are made from various materials selected for cost, ease of fabrication, and various functional (mechanical and electrical) requirements. Typical leadframe materials generally include nickel-iron, clad strip, or copper-based alloys.

An important feature of a leadframe is its ability to channel heat from the chip to the exterior of the package which is dependent on the thermal conductivity of the leadframe material. Copper alloy leadframes are desirable from this standpoint. However, copper alloy leadframes also have high thermal-expansion rates (based on coefficients of thermal expansion) in comparison to silicon, but nearly match the expansion rates of low-stress molding compounds. Consequently, the chip-bonding material, that is, the die-attach material used to bond the chip to the leadframe, must be carefully selected. For example, silicon/gold eutectic bonding cannot be used with copper frames because its high elastic modulus couples thermally induced bending stresses generated by leadframe expansion to the silicon of the die, significantly increasing the potential for die fracture. As a result, silver-filled epoxies and polyimide die-attach adhesives have been developed that are flexible enough to accommodate the stress initiated by an expanding copper leadframe so that the die is not subjected to strain.

Leadframes are typically supplied in multi-frame strips designed with automated assembly, wire-bond and packaging system in mind. As such, tooling or indexing holes are located along the leadframe-strip edges to mate with transfer-mechanism elements and alignment pins. Such pins are typically part of the assembly equipment, including die bonders, wire bonders, molds, auto-inspection stations, trim and form equipment, and marking machines.

As noted above, both silicon/gold eutectic as well as adhesive bonding materials have been used to bond the die to the leadframe. For silicon/gold eutectic bonding, the operation typically begins by indexing die on a bonding machine to a heated die support platform. Leadframes are then fed from magazines, along a track to a heater block. A small square of silicon/gold alloy (typically 6% Si, 94% Au) is cut from a feed ribbon and transferred to the die support platform, also called a die-attach paddle, tab or island. Die and eutectic are then scrubbed together, forming a hard alloy bond. The heater temperature is approximately 420° C. and the total cycle time for eutectic bonding is about 6 to 8 seconds.

Adhesive bonding is faster than eutectic, with a cycle time of about 2 seconds. Typical feed mechanisms for polymer bonding machines are the same as eutectic bonders. The leadframes, however, are usually not heated. Silver or gold-filled epoxy or polyimide adhesive paste is transferred to the die support platform by a print head, and a die is pressed into the paste immediately after printing. Die bonding adhesives manufactured by Epotek, Amicon and Ablestick are typically electrically conductive, have maximum cure temperatures up to 275° C., and have lap shear strengths up to 2.11 kg/mm$^2$.

The die bonded leadframe strips are subsequently loaded into transport magazines. Eutectic-bonded frames go directly to a wire bonding station, while magazines containing adhesive-bonded frames are routed to ovens for curing. The curing atmosphere is typically dry nitrogen and usually requires one hour at 150° C. to cure, followed by 30 minutes at 275° C. for polyimide adhesives.

A large number of polymers, copolymers, and polymer blends have been developed in the past several decades with the aim of joining composites. Epoxies, however, have been the primary material used to bond laminates, and such adhesives have been the principal bonding agent for printed circuits. Due to their ability to react with many types of compounds and to enter solid solution with a variety of modifiers, epoxies can be formulated to meet most requirements that do not exceed their use temperature of 125° to 150° C. For thermoplastic adhesives requiring the adhesive material to be heated to temperatures around 200°–300° C., up to three hours of cure time may be required to remove any solvents. Epoxies, moreover, are generally very viscous and consequently somewhat difficult to handle and apply.

Acrylics have been customarily used as adhesives for polyimides, requiring temperatures higher than the maximum use temperatures of epoxies. Polyimidesiloxane hybrids have also been used that have superior thermal resistance and good compatibility for this purpose. For applications requiring the highest temperature or the most demanding dielectric requirements, polyperfluorocarbons may be used. Perfluorethylenepropylene copolymer films also exhibit suitable adhesion if the adherend surface is prepared properly.

Typically, rough or absorbent adherends readily bond together. Smooth, impervious materials, however, are much more difficult to adhere, and these are more typical of printed-circuit substrates. Smooth surfaces, even if clean, usually cannot be bonded unless roughening or chemical treatment of the adherend surface precedes adhesive application. Metal surfaces too smooth to be bonded can be roughened by abrasion, but more frequently unalleviated metal surfaces as on power or ground planes are prepared for bonding by chemical modification. Alkaline oxidation of copper provides an instant oxide surface more polar and irregular than the original. Chelates such as benzotriazoles bond well to the oxide that is always formed on copper and can be stable to 200° C. These chelates allow good adhesion to organics, have high cohesive strength, and serve as corrosion inhibitors when used as coatings.

Typical prior art devices apply die bonding adhesives by rolling, stamping, tape application, or spraying. That is, an adhesive-bearing roller or a stamp may be used to apply the adhesive to the die-attach area of the leadframe. Similarly, a mask may be placed over the portion of the leadframe where adhesive is not desired and a spray nozzle may spray the masked leadframes with the desired adhesive. Other methods have also been developed, such as that disclosed in U.S. Pat. No. 5,286,679, in which a patterned adhesive layer is deposited by hot or cold screen printing the adhesive, by photopatterning a photosensitive adhesive, or by utilizing a resist method of etch back. Adhesive-coated tapes have also been utilized to bond the die to the leadframe, as disclosed in U.S. Pat. No. 5,304,842, as well as adhesive patches applied from tape carriers, as disclosed in U.S. Pat. No. 5,448,450.

The prior art systems, however, have several notable disadvantages. For example, such systems may not evenly distribute the adhesive across a die-attach paddle of the leadframe. Moreover, application of an adhesive having large particle sizes may cause voids or bubbles to form on the leadframe. Other adhesive applicator apparatuses do not draw the adhesive evenly onto the die-attach paddle or the leadfingers (in the case of a leads-over-chip, or LOC, die-attach) and may have relatively slow cycle times. In addition, many prior art systems do not fully enclose or focus the adhesive application process to substantially reduce, if not substantially eliminate, contamination of equipment components and leadframe areas where adhesive is not desired. Prior art systems may also require an additional, preliminary masking step in the manufacturing process to ensure that the adhesive is only applied to desired locations. Finally, many prior art systems may require an extended curing cycle in an oven, for example, to cure the adhesive or epoxy. In some systems, after die-attach, an optical alignment system checks to ensure that the die has been properly placed, translationally and rotationally, on the leadframe. Between die-attach and wire bonding, however, dies requiring an extended epoxy cure cycle often have their orientation or placement distorted as the adhesive cures, adversely affecting the wire-bond operation and, thus, quality and reliability of the product.

It is also desirable in some circumstances to apply adhesive to a wafer surface for so-called leads-over-chip or LOC mounting of a die under the leads of a leadframe without a die-attach paddle. Currently, screen-printing is employed to selectively coat the wafer. Alternatively, a spin-on process may be employed to coat the entire wafer surface, followed by selective etching away of the adhesive in undesired locations. Adhesively-coated tapes are also employed for LOC die-attach. Such processes, as with those previously described, leave much to be desired in terms of process time, ease of use, and resulting product quality.

Thus, it would be advantageous to provide an apparatus for applying an atomized adhesive to a semiconductor device component for die bonding that encloses the adhesive application process, evenly draws the adhesive onto the die paddle and removes excess adhesive, automatically masks or shields each component to protect certain areas from being sprayed with adhesive, and has a relatively fast cycle time.

SUMMARY OF THE INVENTION

Accordingly, the present invention provides a method and apparatus for the precise application of a die bonding adhesive to a semiconductor device component using an injection nozzle to atomize the die-attach adhesive.

In one preferred embodiment, the apparatus includes a containment hood with an associated spray nozzle in communication with an adhesive reservoir and positioned above an adhesive application location or target area. An air purge may be incorporated within the hood to drive the adhesive onto the die-attach paddle area for a further reduction in cycle time. In addition, the plenum of a vacuum or negative-pressure system may also be positioned on the opposite side of (usually below) the adhesive application location from the injection nozzle to help draw the adhesive onto the die paddle and carry away any excess atomized adhesive. The hood and/or lower vacuum system may be connected to a cam system or other mechanism as known in the art that allows for simultaneous opening and closing of the hood and/or vacuum plenum around the target area to allow indexing of semiconductor device components through the apparatus. Further, the apparatus preferably utilizes flexible seals on the edges of the hood and lower vacuum assembly to contain the adhesive application process to the area where adhesive deposition is desired. When the apparatus is used to apply adhesive to leadframes, the seals may contact the dambars and side rails of the leadframe to provide the maximum amount of vacuum and adhesive leakage from the target area.

In one aspect of a preferred embodiment, the apparatus has a shutter-type mechanism that opens an aperture above the leadframe, allowing a vacuum to draw the atomized adhesive mixture evenly onto the die-attach paddle for a specified cycle time. Preferably, the adhesive is atomized to a particle size of 50–100 $\mu$m. The aperture is sized and shaped to cover various portions of the leadframe to shield those portions and prevent application of adhesive thereto.

After a leadframe has been fed into the target area, the die paddle will be located under the hood. The leadframe may be optically and/or mechanically aligned by methods known in the art. A mechanical alignment system employing the leadframe strip indexing holes is preferred for simplicity and substantial immunity to contamination by adhesive. The cam system then closes and seals the hood and the vacuum assembly plenum about the leadframe. A shutter positioned above the leadframe opens and a mask covers the surrounding area of the leadframe that does not require any adhesive. The injection nozzle inside the hood injects, under high pressure, a selected quantity of adhesive that atomizes and mixes with air provided to the containment hood from an exterior source, which is normally outside of the clean room where the adhesive application apparatus is located. The vacuum below the leadframe pulls the atomized adhesive particles downwardly and deposits them evenly onto the die paddle.

Using an electronic or mechanical timing device, the shutter may be released to close once a pre-defined amount of adhesive has been injected. The shutter, as well as dictating exposure of the leadframe to the adhesive mist, also substantially prevents adhesive dripping. For faster cycle times, an additional air purge within or above the hood and behind or above the atomizer nozzle can be utilized to apply a small air burst or puff to help accelerate and direct the adhesive toward the leadframe. After the adhesive has been applied, the shutter closes, the cam system opens the hood, and a feed mechanism indexes the leadframe toward the next position. By design, the apparatus of the invention can be placed in an otherwise conventional die-attach sequence in place of, for example, a conventional epoxy stamp.

The hood, shutter mechanism, and vacuum system preferably incorporate one or more drainage channels for collection and removal of excess adhesive. If the volume of air under the hood becomes oversaturated with adhesive, for example, causing the adhesive to drip, the drainage channels can collect the adhesive and recycle it to the adhesive reservoir. Cleaning the system of the invention should be less frequent than other spray-type systems because the excess adhesive is pulled into a recirculating or disposal system.

In another preferred embodiment, the hood, vacuum system, and shutter can be modified to simultaneously accommodate multiple leadframes, if desired, such that the adhesive could be applied across all desired leadframe areas of a leadframe strip simultaneously in one cycle.

Preferably, the adhesive employed with the application system of the invention should have characteristics similar to epoxies currently available. That is, the adhesive must be conductive and may be colored or otherwise detectible by an automatic imaging system. Further, the adhesive should be provided in liquid form or liquefied prior to atomization by heating to a desired viscosity for proper atomization. Adhesives having a relatively low solvent content would have the effect of greatly reducing the amount of cure time. Moreover, use of such an adhesive formulated to have a cure time of 10 seconds or less after application to the die paddle could eliminate the entire oven-cure process and provide for immediate, aligned attachment and immobilization of the die on the leadframe. Moreover, an adhesive having these characteristics could reduce total process time by 2–3 hours by eliminating elevated temperature cure time in an oven. In selecting such an adhesive, the effects of temperature encountered during a transfer molding or other encapsulation process should also be considered.

The apparatus and method herein described will prevent excess adhesive from being deposited on the leadframe, provide more precise and evenly distributed adhesive application, increase the reliability of the process, and produce faster cycle times than prior art systems. Moreover, an increased adhesion area of adhesive will result due to the small particle size of the atomized adhesive, eliminating uncoated inter-particle spaces and filling any voids or vugs on the surface of the leadframe or other semiconductor device component. The potential for bubbles or voids within the adhesive layer will also be substantially reduced as compared to application of thicker, more viscous epoxies used in the art.

In another preferred embodiment, an adhesive spray may be aimed toward a wafer instead of being misted and then drawn toward the target by air flow. For example, a wafer is loaded onto a working platen by a mechanical loading arm. Once on the platen, the wafer is held in place by a vacuum and aligned by an imaging alignment system using fiducial marks as known in the art. After alignment, a stencil is automatically placed on the surface of the wafer to mask the areas where adhesive is not desired. The hood then seals around the wafer periphery and a spray nozzle aimed toward the wafer deposits an even coating of adhesive. The spray nozzle may be translatable along a spray path over the wafer, or multiple nozzles used on a fixed or translatable spray bar. Multiple passes of the nozzle(s) could thus be made depending on the spray area, adhesive volume delivered per pass, and adhesive thickness desired. The stencil is then removed and the wafer unloaded by a mechanical arm. The process is then repeated for other wafers. When sufficient adhesive material accumulates on the stencil, the stencil is removed and replaced with a clean one. Alternatively, the stencil may be cleaned after each wafer, or the stencil fabricated from a disposable material and discarded after one or more uses.

Similarly, when spraying leadframes according to the above-described embodiment, a mechanical arm or conveyor loads a leadframe or strip of frames to an adhesive application location or target area. When the leadframe or strip is properly positioned and masked by stencil, if desired, a sensor stops leadframe movement and the spray nozzle or nozzles deposit the adhesive. When spraying is complete, the stencil is lifted, and the leadframe or strip is removed by the mechanical arm or moved along by the conveyor to the pick-and-place die-attach station. The invention thus reduces cycle time through full automation of the equipment, reduction in the number of cleaning cycles, and reduced adhesive application and die-attach time. The system has utility with all types of leadframes, including those with a die-attach paddle as well as LOC lead frames, for which it is particularly well-suited.

In either system described above, the machine parameters such as spray pressure, temperature, nozzle height, nozzle speed, nozzle type, nozzle aperture size, spray pattern, cycle time, and (where applicable) vacuum or negative pressure below the target area would be dependent on the adhesive material used and desired thickness of the adhesive. It should be noted that references to adhesives and other bonding agents in the specification and claims comprise adhesives such as epoxies as well as all other sprayable bonding materials as known in the art.

In addition, the invention disclosed herein has equal application and utility with regard to the coating of leadframes, leadframe strips, conductor-carrying boards and other substrates, semiconductor wafers, partial wafers and singulated dies, although the latter may not be practical for high-volume operations. Thus, the use of the term "semiconductor device component" as used in the specification and claims connotes any of these items, and contemplates the application of adhesives thereto.

BRIEF DESCRIPTION OF THE DRAWINGS

FIG. 7 is a schematic drawing of another preferred embodiment of an apparatus in accordance with the present invention; and FIG. 8 is a top schematic elevation of a stencil covering a strip of leadframes.

DETAILED DESCRIPTION OF THE PREFERRED EMBODIMENT

Figure 1:
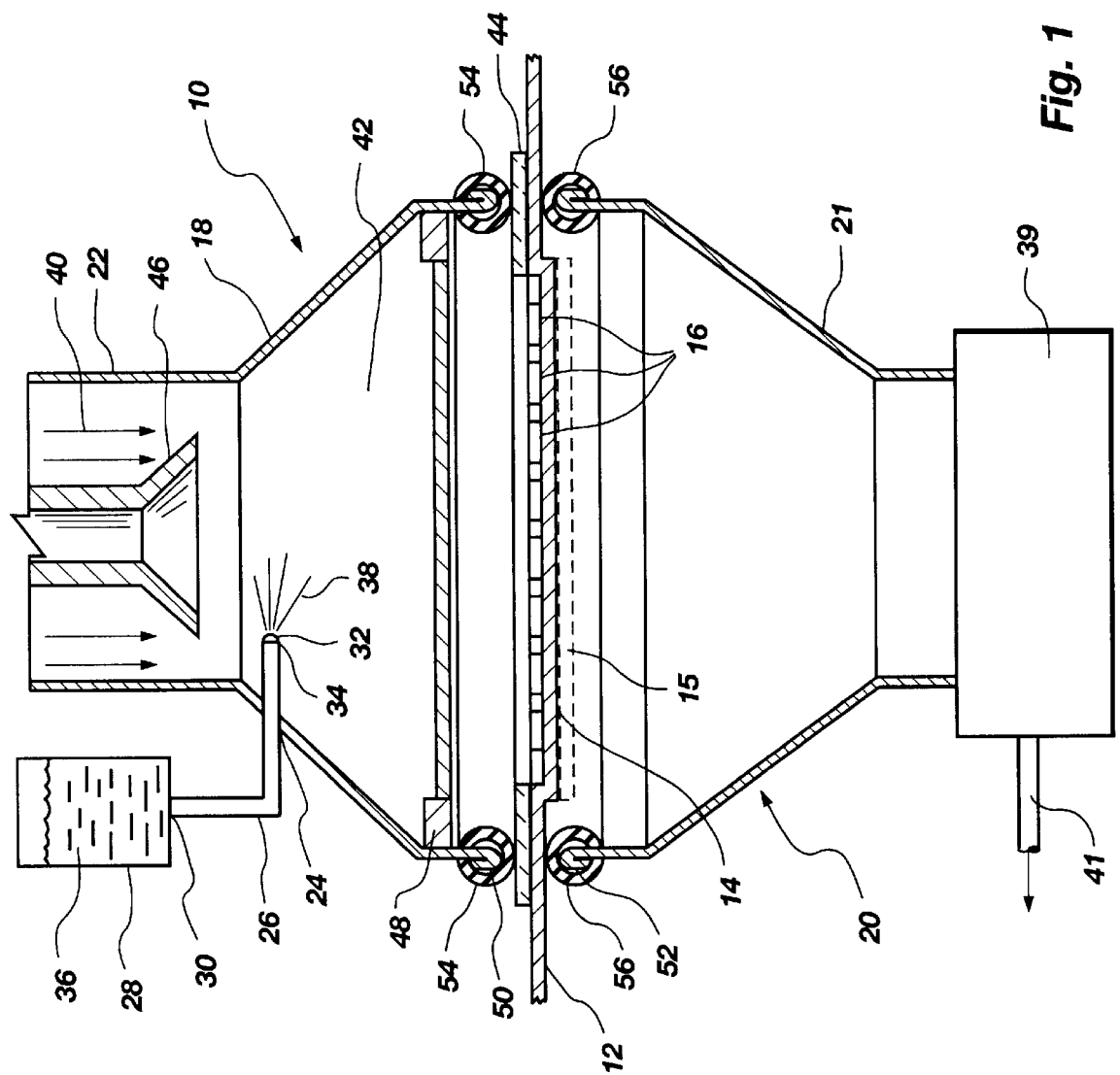
FIG. 1 is a schematic view of an adhesive application apparatus in accordance with the present invention.

In FIG. 1, an exemplary leadframe 12 is shown positioned within the target area of an adhesive application apparatus 10 of the present invention. Leadframe 12 includes a die-attach paddle 14 and leadfingers 16 (see FIG. 3), in this instance, the paddle 14 being downset from the fingers 16, as known in the art. The apparatus 10 is comprised of a containment hood 18 and a vacuum system 20. The hood 18 as shown has a tapered configuration, being wider near the leadframe 12 and narrowing toward its distal end, where it is connected to feed air duct 22, which provides air from a source exterior to the containment hood. The hood 18 could have any configuration as long as the adhesive application process can be suitably focused and contained. The hood 18 has an adhesive port 24, through which a delivery tube 26 extends. The tube 26 communicates with an adhesive reservoir 28 at its first end 30 and a nozzle 32 at its second end 34. The nozzle 32 is preferably an atomizer nozzle capable of dispersing adhesive 36 supplied by the adhesive reservoir 28 at a particle size of 50–100 μm. Adhesive may be supplied under pressure by use of a pressurized gas as a propellant, a positive-displacement pump, or by other means known in the art.

Duct 22 above applicator hood 18 is connected to a positive- or ambient-pressure clean (filtered and of controlled humidity) air supply as known in the art so that air 40 can enter the hood 18 and carry the atomized adhesive 38 downward. The air 40 and atomized adhesive 38 mix in a mixing chamber 42 formed by the hood 18. An aperture panel or mask 44 covers portions of the leadframe 12, such as the leadfingers 16 in FIG. 1, where adhesive 38 is not desired.

Below the leadframe 12, the vacuum system 20 provides a negative pressure zone such that adhesive 38 is quickly drawn downward onto leadframe 12, with the excess pulled into the vacuum system 20 so that only the upper side of the leadframe is coated with adhesive by reduction of backspatter, and to reduce lateral overspray potential. The vacuum system 20 is shown to have a plenum 21 similar in shape to the hood 18, but may have any configuration suitable to draw the adhesive 38 through the leadframe 12. The negative pressure can be as great or as little as desired dependent upon various process parameters such as cycle time, adhesive particle size, and desired thickness of adhesive layer. Moreover, as the vacuum system 20 collects the excess or over-sprayed adhesive 38, the unapplied adhesive can be recycled to the adhesive reservoir 28 by recycling system 39 as known in the art through tube 41.

In addition to the air 40 provided by feed duct 22, a gas purge 46 fed from a compressed or pressurized gas source of adequate quality may be incorporated into or above the hood 18 as shown to provide puffs or bursts of air to accelerate and directionalize the adhesive 38 toward the leadframe 12 and minimize lateral dispersion of the mist. The gas purge 46 may be necessary to further reduce cycle times.

The containment hood 18 may also include a shutter 48 positioned at or near the bottom of the chamber 42 and above the leadframe 12. Shutter 48 may be laterally translatable and may comprise a two-panel arrangement extendable and retractable from opposing sides of hood 18 for more rapid closure. The shutter 48 is positionable over the leadframe 12 to prevent additional adhesive 38 from being deposited onto the die paddle 14 after a predetermined period of time. Thus, the nozzle 32 atomizes the adhesive 38, and the adhesive 38 is drawn onto the die paddle by the air 40 and, if desired, driven by the air purge 46. After a desired volume or layer thickness of the adhesive 38 is deposited on the die paddle, the shutter 48 closes until another leadframe 12 is positioned within the apparatus 10. The hood 18, aperture panel 44, and shutter 48 may also collect and recycle excess adhesive 38 using drainage channels attached to, or formed in, their surfaces. Aperture panel 44 and shutter 48 may be combined.

As shown, the lower edge 50 of the hood 18 and the upper edge 52 of the vacuum system plenum 21 are provided, respectively, with resilient or flexible seals 54 and 56. Seals 54 and 56 may comprise, for example, flexible skirts or compressible elastomers. The seals 54 and 56 respectively engage with the upper and lower surfaces of leadframe 12 when the apparatus 10 is in a closed position, such that the adhesive application process is substantially contained within a defined area. As such, components and equipment external to the hood 18 and vacuum system 20 are not exposed to adhesive 38, and atomized adhesive 38 is not exposed to stray air currents in the assembly area.

The leadframe 12 or a strip of frames may be carried into the target area under the containment hood 18 on a carrier to protect (mask) the lower surface against backspatter during adhesive coating. A strippable polymer film might also be employed to cover that surface. The leadframe might also be superimposed over or even placed on a backspatter barrier. The upper surface of the barrier is cleaned, or the barrier replaced, when contaminated by adhesive. Element 15 of FIG. 1, shown in broken lines, depicts placement of such carrier, film or barrier with respect to leadframe 12.

Figure 2:
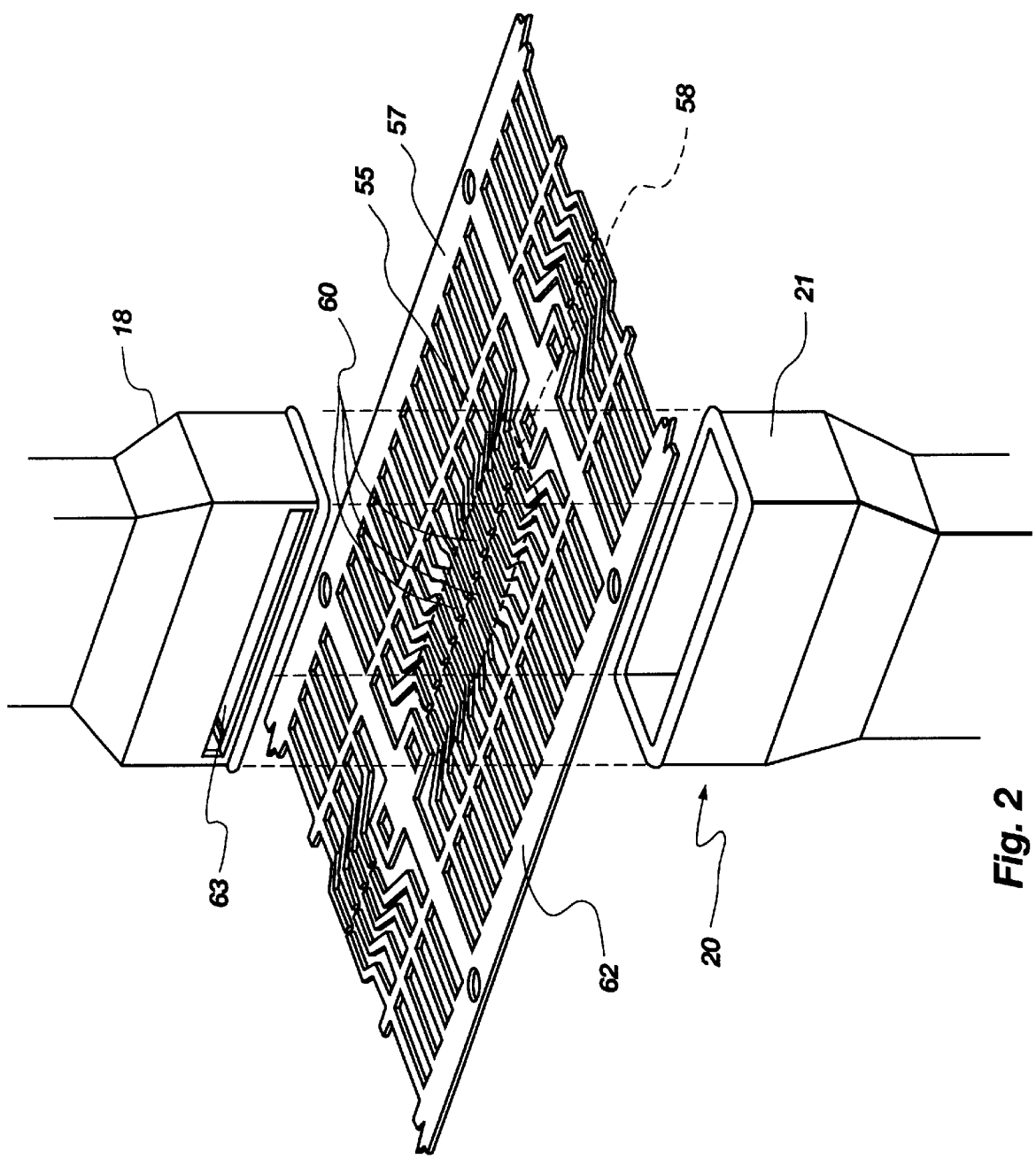
FIG. 2 is a perspective view of the adhesive application apparatus of the present invention showing its alignment with a typical LOC leadframe.
Figure 3:
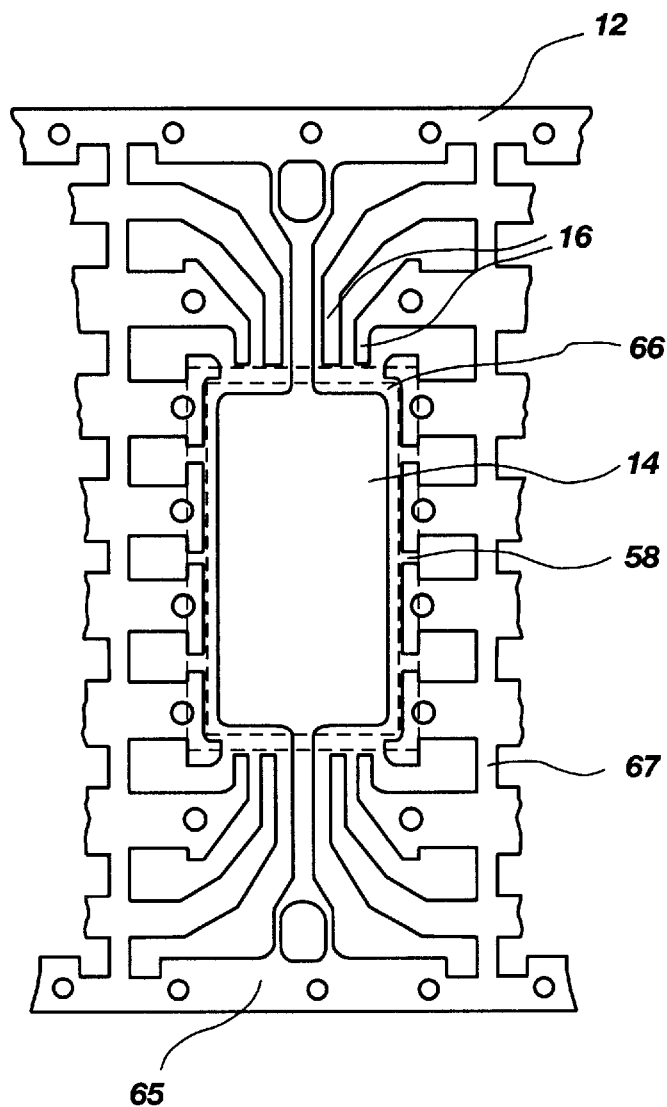
FIG. 3 is a schematic drawing of a typical leadframe with a die paddle showing the position of the adhesive application apparatus in dashed lines.

Referring to FIG. 2, the relative size and shape of the hood 18 and vacuum system plenum 21 in relation to an exemplary LOC leadframe 62 of one embodiment of the present invention is shown. As shown in dashed lines, the adhesive application location or footprint 58 extends around the leadfingers 60 such that only those portions of the leadframe 62 where adhesive 38 is desired are exposed to the adhesive application process of the present invention. The footprint 58 may also extend to the dambars 55 or siderails 57 to enhance sealing with hood 18 and vacuum system plenum 21. If so, an aperture panel or mask 44 would be desirable to shield selected portions of the leadframe 62. As shown, the hood 18 has an opening 63 to allow lateral insertion and retraction of the shutter 48, it being understood that a sliding seal would be provided between the periphery of opening 63 and shutter 48. Similarly, FIG. 3 shows an exemplary footprint 64 of a hood 18 in relation to an exemplary leadframe 12 with a die-attach paddle 14. As shown, the footprint 64 may extend to the side rails 65 and dambars 67 to achieve the best seal. Flow area 66 between peripheral hood footprint 64 and die-attach paddle 14 should be carefully considered with the pressure balance of the system to provide for adequate fluid flow past leadframe 12.

Figure 4:
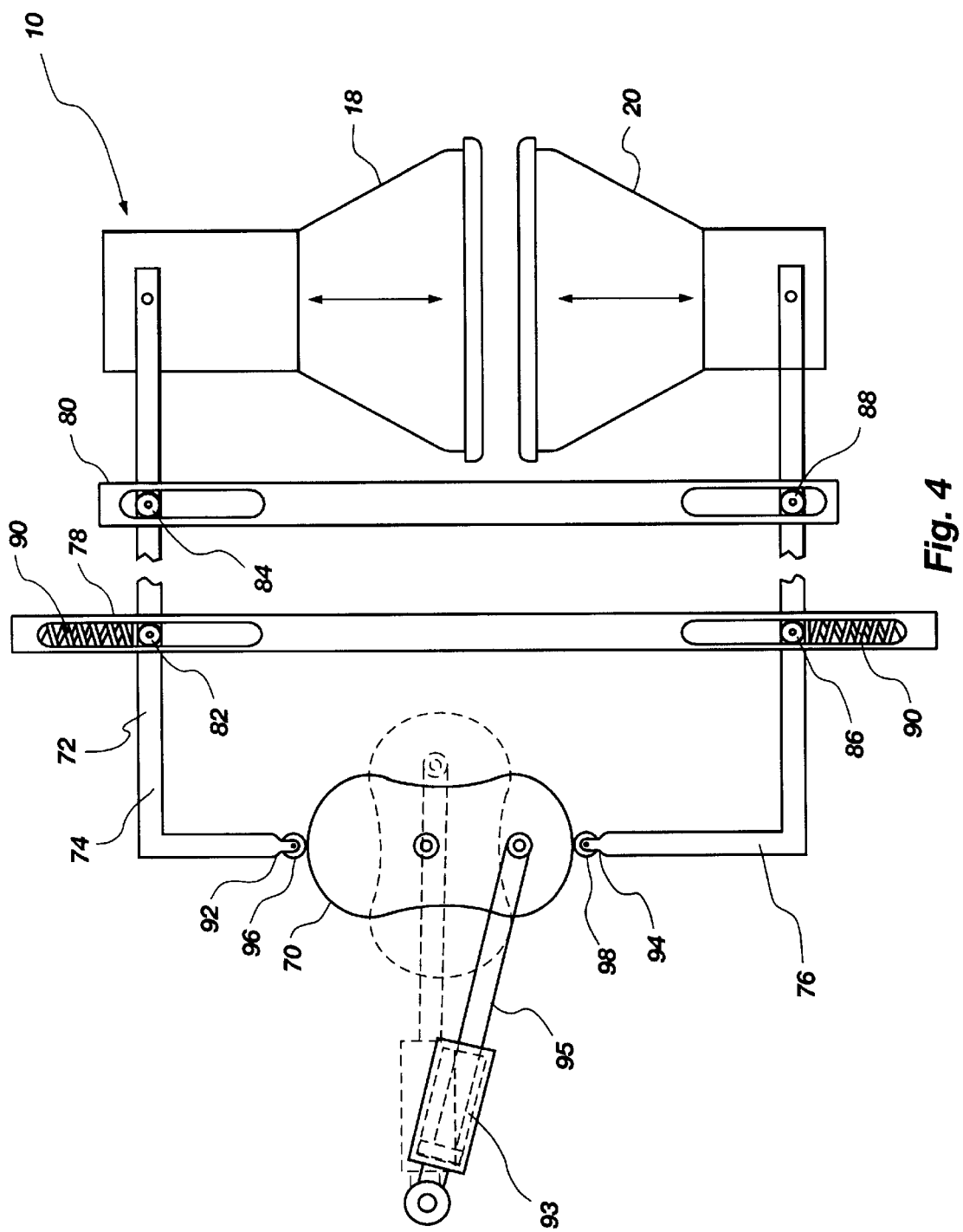
FIG. 4 is a schematic drawing of the adhesive application apparatus in conjunction with a cam system to open and close the apparatus.

FIG. 4 shows a cam 70 and linkage structure 72 attached to the hood 18 and vacuum system 20 to open and close the adhesive application apparatus 10. The linkage structure 72 is comprised of an L-shaped member 74 linking the hood 18 to the cam 70 and an L-shaped member 76 linking the vacuum system 20 to the cam 70. Between the cam 70 and the hood 18, the L-shaped member 74 is translatably attached to elongate support members 78 and 80 by pins 82 and 84, respectively. Likewise, between the cam 70 and the hood 18, the L-shaped member 76 is translatably attached to elongate support members 78 and 80 by pins or bushings 86 and 88, respectively. At their proximal ends 92 and 94, the L-shaped members 74 and 76 are attached to rollers 96 and 98, respectively. In addition, the L-shaped members 74 and 76 are biased by springs 90. The spring 90 biases the L-shaped members 74 and 76 toward each other. Cam 70 may be driven between two positions as shown by a pneumatic, hydraulic or electric (linear motor) cylinder 93 through a rod and pivot linkage 95 as shown. The cam 70 may also be driven by a rotary electric motor or a pneumatic or hydraulic drive system that is capable of varying speeds and/or incremental rotation. In either such arrangement, as the cam 70 rotates, depending on the position of the cam 70 relative to the rollers 96 and 98, the hood 18 and the vacuum system plenum 21 are either in a closed or open position.

Other methods and structures known in the art can be used to engage and disengage the hood 18 and the vacuum 20 in a cyclic manner. In addition, those skilled in the art will appreciate that it may not be necessary to move both the hood 18 and/or the vacuum system 20, depending on the system employed to position leadframes 12 at an adhesive application location. For example, a conveyor system may be able to simply move leadframes through the apparatus without having to raise and lower upper and lower components if, for example, movable seals are employed at the inlet and outlet sides of the target area.

Figure 5:
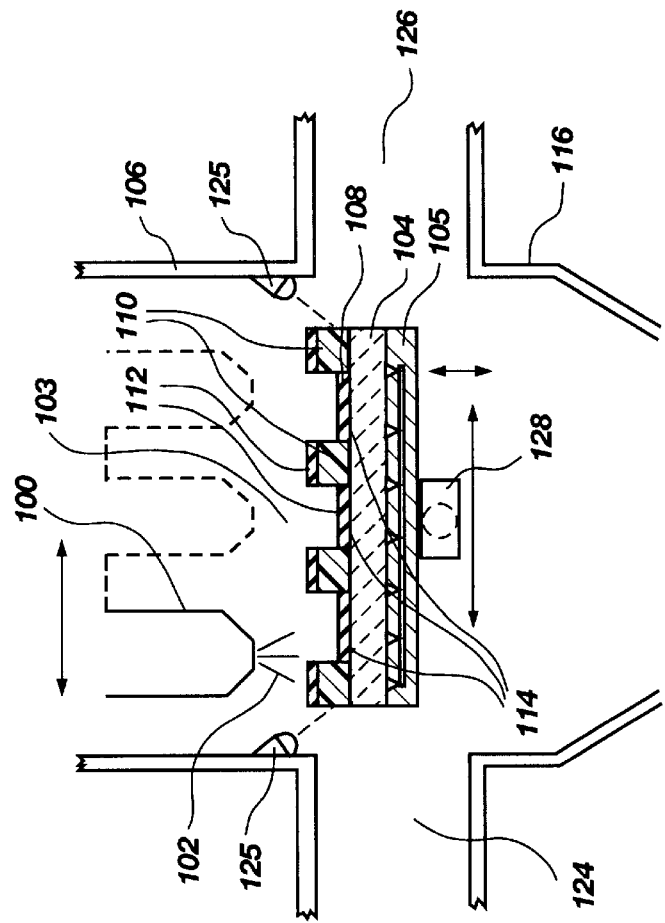
FIG. 5 is a schematic drawing of an adhesive application apparatus of the invention for adhesive application to wafers.

FIG. 5 shows another preferred embodiment in which a translatable nozzle 100 directs an adhesive spray 102 within target area 103 onto the desired device component 104, in this case an uncut wafer 104 held on a working platen 105 having a vacuum retention system. The nozzle 100 may be translatable within a spray containment surround 106 in both an X and Y direction, that is, across the entire surface 108 of the wafer 104, and may comprise multiple nozzles on a spray bar (shown in broken lines) translatable in one or more directions. One or more optical or mechanical alignment sensors 125 as known in the art may also be used to properly align the wafer 104 and/or the stencil 110 with respect to the wafer 104 (if not preassembled before placement in the target area), if required. As shown, the wafer 104 is covered by a stencil 110 that allows adhesive 112 to deposit on desired locations 114 of the wafer 104 while being blocked by the stencil 110. A vacuum system 116 below target area 103 may optionally provide a negative pressure such that any excess spray of the adhesive 102 is removed from the target area. This negative pressure, however, is not required and if used, is not of great enough magnitude to cause turbulent flow across the stencil 110. After adhesive application, the wafer 104 can be indexed through the opening 124 and another inserted through opening 126 by, for example, a mechanical arm 128 or other conveyor mechanism.

Figure 6:
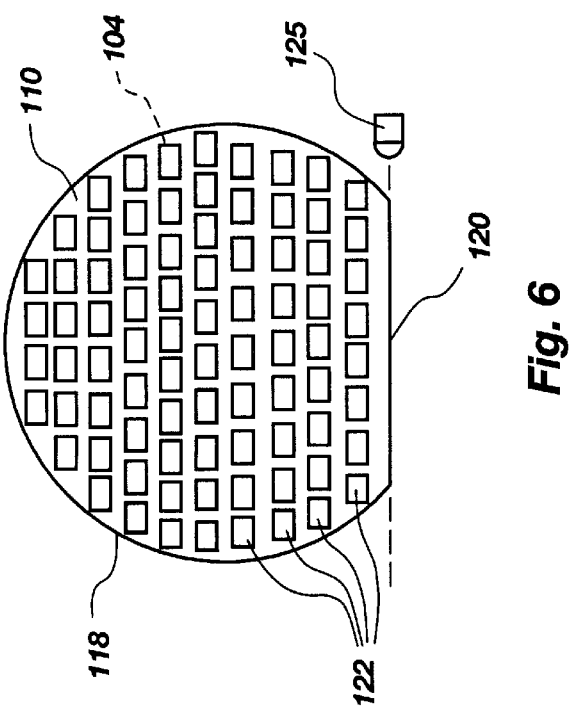
FIG. 6 is a schematic drawing of a stencil positioned over a wafer.

The stencil 110 as employed in FIG. 5 is shown from above in FIG. 6 superimposed on wafer 104 and has a semicircular outer surface 118 with a flat 120 across one end to match the wafer flat. The stencil 110 has openings 122 sized, shaped and positioned to match the individual die locations of the wafer 104. The stencil 110 is positioned over the wafer 104 with a mechanical arm or other means known in the art. An optical or mechanical alignment system 125, as known in the art, may be employed to ensure exact alignment of stencil 110 with wafer 104.

The same type of directed or aimed spray nozzle or nozzles 100 can be used to apply adhesive 102 to a leadframe 130, shown schematically in FIG. 7 as an LOC leadframe. As shown, a leadframe 130 (which may also comprise a strip comprised of multiple frames) is conveyed by a conveyor system 132 comprised of a first conveyor guide rail 134 and a second conveyor guide rail 136. Guide rails 134 and 136 are preferably U-shaped with their open ends receiving the side edges of the leadframe or multiple-frame strips. Both the first and second conveyor rails 134 and 136 have associated transfer-mechanism elements and alignment pins 138 that may engage the tooling or indexing holes 140 in the leadframe 130 responsive to the output of a sensor 135 detecting the presence or position of the leadframe. As such, the conveyor system 132 can properly position the leadframe relative to a nozzle 100, which is configured such that the periphery of spray pattern 142, as shown in broken lines, only extends to the inner ends of leadfingers 144. Of course, a mask may also be used to delineate the spray pattern. Any spray that falls between the leadfingers 144 can be collected by a vacuum system 116, reducing the necessity for, and frequency of, cleaning.

If one desires to simultaneously apply adhesive to multiple frames of a leadframe strip (see FIG. 2), a multi-aperture mask or stencil 150 as shown in FIG. 8 may be useful. As shown, the stencil can be positioned over a leadframe strip such that only the leadfingers 152 (or die-attach paddles, if a conventional leadframe) are exposed through the openings or apertures 154 of the stencil 150. Thus, adhesive 102 can be applied to multiple leadframes simultaneously, requiring fewer cycles of the adhesive application apparatus 10.

It should be understood that various epoxies and other adhesives may be suitable for use in this apparatus. Preferable adhesives which may be formulated for use with the invention include polyimides and siloxane polyimides (also termed polyimide siloxanes), the latter providing enhanced adhesion and increased flexibility in comparison to the former. Moreover, the orientation of the apparatus as shown in the preferred embodiments is for illustration only and, while preferred to take advantage of gravitational forces, may therefore be altered as desired without departing from the scope of the accompanying claims.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An apparatus for applying an adhesive to a semiconductor device component for die bonding, comprising:
    a containment hood;
    an adhesive spray nozzle positioned within said hood;
    a negative pressure plenum mounted below said hood and said adhesive nozzle; and
    a target area located between said adhesive spray nozzle and said negative pressure plenum for application of said adhesive to a semiconductor device component.

2. The apparatus of claim 1, wherein said spray nozzle is an atomizing spray nozzle.

3. The apparatus of claim 1, further including a movable shutter positionable between said spray nozzle and said target area.

4. The apparatus of claim 1, further including an actuator for moving said hood toward and away from said target area.

5. The apparatus of claim 1, further including an actuator for moving said plenum toward and away from said target area.

6. The apparatus of claim 1, further including a gas purge associated with said spray nozzle and aimed toward said target area.

7. The apparatus of claim 6, wherein said gas purge is mounted above said spray nozzle.

8. The apparatus of claim 1, further including a conveyor apparatus for moving semiconductor device components into and out of said apparatus.

9. The apparatus of claim 1, further including sealing members associated with said hood and said plenum for containing adhesive emitted by said spray nozzle.

10. The apparatus of claim 9, wherein said sealing members are adapted to contact said semiconductor device component during application of adhesive thereto in said target area.

11. The apparatus of claim 10, wherein said semiconductor device component comprises a leadframe having a die-attach paddle, and said sealing members are arranged to surround said paddle.

12. The apparatus of claim 10, wherein said semiconductor device component comprises a leadframe including dambars, and said sealing members are aligned with at least some of said dambars to enhance sealing contact with said leadframe.

13. The apparatus of claim 1, further including an adhesive reservoir in communication with said spray nozzle.

14. The apparatus of claim 1, further including a mask positioned within said target area for substantially preventing adhesive from contacting selected portions of said semiconductor device component.

15. The apparatus of claim 1, further including an adhesive recycling system.

16. The apparatus of claim 1, further including a duct associated with said hood for providing an air source thereto.

17. A process for applying an adhesive to a semiconductor device component, comprising:

positioning a semiconductor device component within a target area;

spraying an adhesive above said target area; and providing a relatively negative pressure below said target area.

18. The process of claim 17, further including substantially containing said sprayed adhesive in a chamber within which said target area is located.

19. The method of claim 17, wherein said semiconductor device component is at least a portion of a wafer.

20. The method of claim 17, wherein said semiconductor device component is a leadframe or strip including a plurality thereof.

21. The method of claim 17, further including providing an air source exterior to the location of said target area.

22. The method of claim 21, further including atomizing said adhesive and admixing said adhesive with air from said air source.

23. The method of claim 17, further including isolating said semiconductor device component from said adhesive spray after exposure to a predetermined amount of adhesive.

24. The method of claim 17, further including masking a portion of said semiconductor device component from said adhesive spray.

25. The method of claim 17, further including directing said adhesive spray toward said target area with an air burst.

26. The method of claim 17, further including containing said adhesive spray to at least one selected area of said semiconductor device component.

27. The method of claim 17, further including recycling at least a portion of said adhesive spray which does not adhere to said semiconductor device component.

28. The method of claim 17, wherein said semiconductor device component comprises a substrate carrying conductors to which at least one die is to be adhered.

29. The method of claim 17, wherein said semiconductor device component comprises a die.

* * * * *